(12) United States Patent
Park et al.

(10) Patent No.: US 12,099,393 B2
(45) Date of Patent: Sep. 24, 2024

(54) POWER MANAGEMENT APPARATUS AND VEHICLE HAVING THE SAME

(71) Applicants: Hyundai Motor Company, Seoul (KR); Kia Corporation, Seoul (KR)

(72) Inventors: Myoung Soo Park, Yongin-Si (KR); Sungtae Kim, Yongin-Si (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 101 days.

(21) Appl. No.: 17/968,632

(22) Filed: Oct. 18, 2022

(65) Prior Publication Data

US 2023/0205294 A1 Jun. 29, 2023

(30) Foreign Application Priority Data

Dec. 23, 2021 (KR) .......................... 10-2021-0185707

(51) Int. Cl.
*G06F 1/30* (2006.01)
*G06F 1/3212* (2019.01)
*G06F 1/3296* (2019.01)

(52) U.S. Cl.
CPC .............. *G06F 1/30* (2013.01); *G06F 1/3212* (2013.01); *G06F 1/3296* (2013.01)

(58) Field of Classification Search
CPC ......... G06F 1/30; G06F 1/3212; G06F 1/3296
See application file for complete search history.

(56) References Cited

U.S. PATENT DOCUMENTS

| | | | |
|---|---|---|---|
| 2013/0099793 A1* | 4/2013 | Shimizu ................. | H02J 7/005 324/426 |
| 2014/0358346 A1* | 12/2014 | Katrak .................... | B60R 16/03 713/300 |
| 2020/0047625 A1* | 2/2020 | Kim ........................ | B60L 58/12 |
| 2022/0198843 A1* | 6/2022 | Choi ...................... | H01M 10/48 |
| 2022/0399727 A1* | 12/2022 | Roumier ................ | H02J 1/082 |

FOREIGN PATENT DOCUMENTS

KR 10-2019-0033763 A 4/2019

\* cited by examiner

*Primary Examiner* — Nimesh G Patel
(74) *Attorney, Agent, or Firm* — Morgan, Lewis & Bockius LLP

(57) ABSTRACT

A vehicle includes a power management apparatus including a first voltage sensor detecting a voltage applied to the first main signal line and output first voltage information about the detected voltage; a second voltage sensor detecting a voltage applied to the second main signal line and output second voltage information about the detected voltage; a first communicator communicating with the master control devices connected to the power signal lines, respectively; and a first processor configured to determine whether a failure in power supply of the battery has occurred or a discharge of the battery has occurred based on the first voltage information and the second voltage information received from the first voltage sensor and the second voltage sensor, and determine whether a failure in power supply through the power signal lines has occurred based on pieces of voltage information received from the master control devices, respectively, through the first communicator.

10 Claims, 9 Drawing Sheets

FIG. 9

| VEHICLE STATE | POWER CONTROL DEVICE | | FIRST MASTER CONTROL DEVICE | | SECOND MASTER CONTROL DEVICE | | THIRD MASTER CONTROL DEVICE | | FOURTH MASTER CONTROL DEVICE | | NOTIFICATION INFORMATION |
|---|---|---|---|---|---|---|---|---|---|---|---|
| | B+1 | B+2 | B+1 | IG1 | B+1 | ACC | B+2 | IG3 | B+2 | IG2 | |
| PARKING AND STAY (KEY-OFF) (BATTERY POWER SUPPLY MODE) | LESS THAN REFERENCE VOLTAGE | LESS THAN REFERENCE VOLTAGE | LESS THAN REFERENCE VOLTAGE | Don't Care | LESS THAN REFERENCE VOLTAGE | Don't Care | LESS THAN REFERENCE VOLTAGE | Don't Care | LESS THAN REFERENCE VOLTAGE | Don't Care | BATTERY CHARGING REQUIRED TO CHARGE BATTERY BEFORE TRAVEL INSPECTION REQUIRED DUE TO ABNORMALITIES IN POWER SYSTEM |
| | LESS THAN REFERENCE VOLTAGE | NORMAL | LESS THAN REFERENCE VOLTAGE | Don't Care | LESS THAN REFERENCE VOLTAGE | Don't Care | NORMAL | Don't Care | 정상 | Don't Care | INSPECTION REQUIRED DUE TO NAVIGATION AND ENGINE NOT WORKING |
| | LESS THAN REFERENCE VOLTAGE | LESS THAN REFERENCE VOLTAGE | NORMAL | Don't Care | NORMAL | Don't Care | LESS THAN REFERENCE VOLTAGE | Don't Care | LESS THAN REFERENCE VOLTAGE | Don't Care | INSPECTION REQUIRED DUE TO LAMP OPERATION AND ELECTRIC VEHICLE CHARGING BEING INOPERABLE |
| | NORMAL | NORMAL | NORMAL | Don't Care | LESS THAN REFERENCE VOLTAGE | Don't Care | NORMAL | Don't Care | NORMAL | Don't Care | INSPECTION REQUIRED DUE TO NAVIGATION NOT WORKING |
| | NORMAL | NORMAL | NORMAL | LESS THAN REFERENCE VOLTAGE | NORMAL | NORMAL | NORMAL | NORMAL | NORMAL | NORMAL | INSPECTION REQUIRED DUE TO ENGINE NOT WORKING |
| STAY (ACC/IG) AND DRIVING (TRAVEL) | NORMAL | NORMAL | NORMAL | NORMAL | NORMAL | NORMAL | NORMAL | LESS THAN REFERENCE VOLTAGE | NORMAL | NORMAL | INSPECTION REQUIRED DUE TO CHARGING INOPERABLE |

POWER MANAGEMENT APPARATUS AND VEHICLE HAVING THE SAME

CROSS-REFERENCE TO RELATED APPLICATION

The present application claims priority to Korean Patent Application No 10-2021-0185707, filed on Dec. 23, 2021 the entire contents of which is incorporated herein for all purposes by this reference.

BACKGROUND OF THE PRESENT DISCLOSURE

Field of the Present Disclosure

The present disclosure relates to a power management apparatus of determining a failure in power supply to electric components, and a vehicle having the same.

Description of Related Art

In general, a vehicle refers to a device for transportation or delivery that travels on a road using fossil fuels, electricity, or the like as a power source.

The vehicle includes driving devices for driving, and further includes various electric components for protecting occupants and providing convenience and fun to occupants.

Furthermore, the vehicle may include a generator for generating electric power and supplying the generated electric power to driving devices and electric components, and a battery for charging the electric power generated by the generator.

Recently, vehicles include high-power electric components that consume a large amount of power, such as an electric steering device, an air conditioning device, a heating wire, and the like.

As the high-power electric components consume a large amount of power for a short time, the voltage of power supplied to the electric components may rapidly decrease, and some electric components may stop operating due to the voltage decrease.

Furthermore, when power supply through the battery fails, some electric components may have power interruption.

Currently, when a failure occurs in electric components or driving devices, it is difficult to determine whether the failure is caused by a failure of power supply or a malfunction of the electric components.

Furthermore, when a failure occurs in driving devices, such as the engine control device, the shift control device, the brake control device, and the steering control device, and electric components directly related to the deriving devices, the failure may lead to an accident.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing power management apparatus configured for determining a failure of power supply through a battery and a failure of power supply for each power signal line based on voltage information of a main signal line connected to the power management apparatus and voltage information of a plurality of power signal lines respectively connected to a plurality of master control devices, and outputting information related to the determined failure as notification information, and a vehicle having the same.

It is another object of the present disclosure to provide a power management apparatus configured for determining a state of a vehicle based on voltage information of a plurality of power signal lines respectively connected to a plurality of master control devices, and a vehicle having the same.

The technical objectives of the present disclosure are not limited to the above, and other objectives may become apparent to those of ordinary skill in the art based on the following descriptions.

According to an aspect of the present disclosure, there is provided a power management apparatus including: a voltage sensor configured to detect a voltage applied to a main signal line connected to a battery and output voltage information related to the detected voltage; a communicator configured to communicate with a plurality of master control devices connected to a plurality of power signal lines, respectively; and a processor configured to determine whether a failure in power supply of the battery has occurred based on the voltage information received from the voltage sensor, and determine whether a failure in power supply through the plurality of power signal lines has occurred based on pieces of voltage information received from the plurality of master control devices, respectively, through the communicator.

The plurality of power signal lines may include an accessory signal line, a first ignition signal line, a second ignition signal line, and a third ignition signal line that are divided according to a state of the power supply.

The power management apparatus may further include an interface configured to branch the main signal line into a plurality of main signal lines and connecting the branched main signal lines to the plurality of master control devices, respectively.

The communicator may be configured to perform communication with an external device, and the processor may be configured to control the communicator to transmit failure information related to the power supply of the battery or failure information related to the power supply through the power signal lines to the external device.

The processor may be configured to determine a state of a vehicle based on voltage information related to a voltage applied to the plurality of power signal lines.

The processor may be configured to determine whether a voltage of the battery is less than a first reference voltage based on the voltage information received through the voltage sensor, and upon determining that the voltage of the battery is less than the first reference voltage, determine that the failure in the power supply of the battery has occurred.

The processor may be configured to determine whether a voltage applied to each of the power signal lines is less than a second reference voltage based on the pieces of voltage information received from the plurality of master control devices, respectively, and determining the power signal line in which the voltage is less the second reference voltage as a failure.

The processor may be configured to identity the master control device connected to the power signal line which is determined as the failure, and control deactivation of the identified master control device.

According to another aspect of the present disclosure, there is provided a vehicle including: a power management apparatus including first and second main signal lines connected to a battery and a plurality of power signal lines connected to the battery and including different states of power supply; and a plurality of master control devices connected to the plurality of power signal lines, respectively, wherein the power management apparatus may include: a first voltage sensor configured to detect a voltage applied to the first main signal line and output first voltage information related to the detected voltage; a second voltage sensor configured to detect a voltage applied to the second main signal line and output second voltage information related to the detected voltage; a first communicator configured to communicate with the plurality of master control devices connected to the plurality of power signal lines, respectively; and a first processor configured to determine whether a failure in power supply of the battery has occurred or a discharge of the battery has occurred based on the first voltage information and the second voltage information received from the first voltage sensor and the second voltage sensor, and determine whether a failure in power supply through the plurality of power signal lines has occurred based on pieces of voltage information received from the plurality of master control devices, respectively, through the first communicator.

Each of the master control devices may be connected to the first main signal line or the second main signal line.

Each of the master control devices may include: a third voltage sensor configured to detect a voltage of one main signal line connected thereto, and output voltage information related to the detected voltage; a fourth voltage sensor configured to detect a voltage applied to one of the plurality of power signal lines and output voltage information related to the detected voltage; and a second processor configured to determine whether a failure in power supply through the connected main signal line has occurred and a failure in power supply through the one power signal line has occurred based on the voltage information detected by the third voltage sensor and the voltage information detected by the fourth voltage sensor.

Each of the master control devices may further include a second communicator, and the second processor may be configured to control the second communicator to transmit failure information related to power supply through the connected main signal line and failure information related to power supply through the one power signal line to the power management apparatus.

The first processor is configured to determine a state of the vehicle based on the voltage information of the fourth voltage sensor provided in each of the master control devices.

The plurality of power signal lines may include an accessory signal line, a first ignition signal line, a second ignition signal line, and a third ignition signal line divided according to a state of power supply.

The first communicator may be configured to perform communication with an external device, and the first processor may be configured to control the first communicator to transmit failure information related to the power supply of the battery or failure information related to the power supply through the power signal lines to the external device.

The first processor may be configured to: determine whether a first voltage of the battery is less than a first reference voltage based on the first voltage information received through the first voltage sensor; determine whether a second voltage of the battery is less than the first reference voltage based on the second voltage information received through the second voltage sensor; and upon determining that the first voltage of the battery is less than the first reference voltage and the second voltage of the battery is less than the first reference voltage, determine that the failure of the battery has occurred or the discharge of the battery has occurred.

The first processor may be configured to, upon determining that the first voltage of the battery is within a range including the first reference voltage and the second voltage of the battery is less than the first reference voltage, determine that the second main signal line has failed, and upon determining that the first voltage of the battery is less than the first reference voltage and the second voltage of the battery is within the range including the first reference voltage, determine that the first main signal line has failed.

The first processor may be configured to: receive pieces of voltage information of the power signal lines from the plurality of master control devices, respectively; determine whether a voltage applied to each of the power signal lines is less than a second reference voltage based on the received pieces of voltage information; and determine a power signal line in which the voltage is less than the second reference voltage as a failure.

The first processor may be configured to identity the master control device connected to the power signal line which is determined as the failure, and control deactivation of the identified master control device.

The vehicle may further include a cluster and an audio/video/navigation (AVN) device, wherein the first processor may control at least one of the cluster or the AVN device to display failure information related to power supply of the battery or failure information related to power supply through the power signal lines.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

BRIEF DESCRIPTION OF THE DRAWINGS

FIG. 9 is a view exemplarily illustrating determining a failure of a vehicle according to an exemplary embodiment of the present disclosure.

Figure 1:
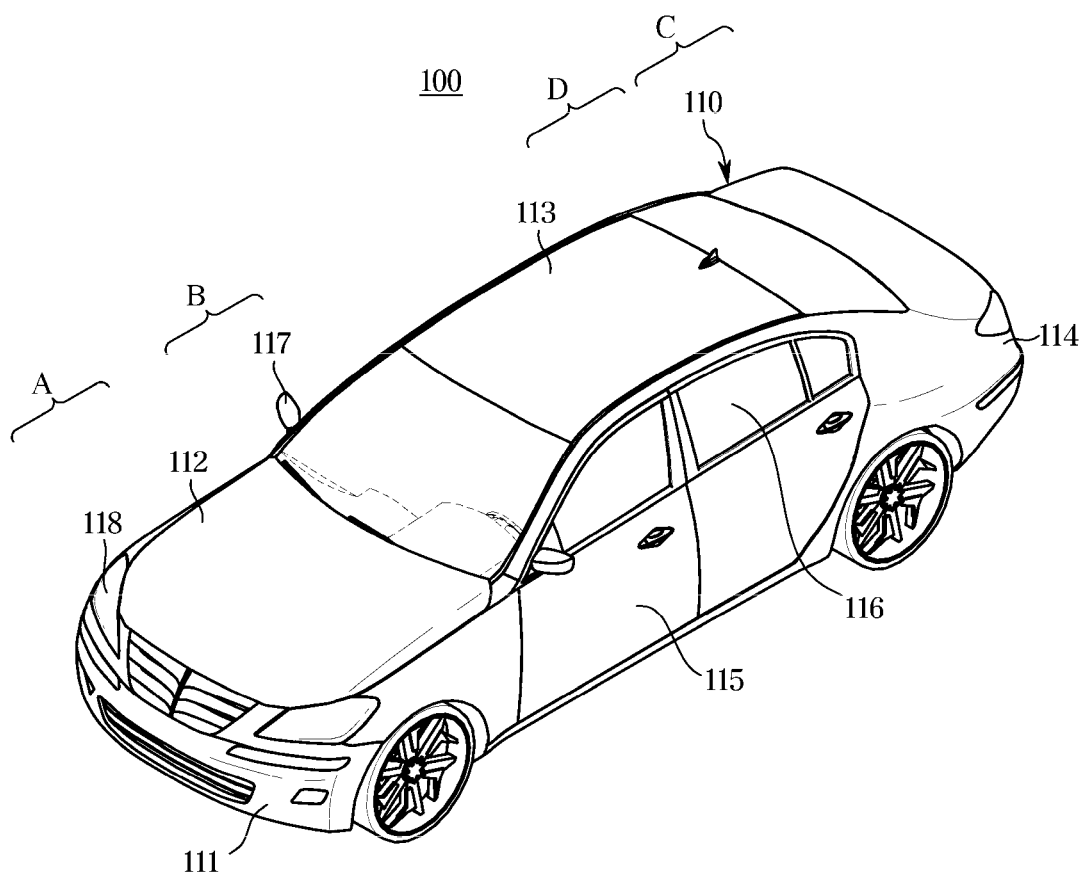
FIG. 1 is a view exemplarily illustrating an exterior of a vehicle body according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Like numerals refer to like elements throughout the specification. Not all elements of embodiments of the present disclosure will be described, and description of what are commonly known in the art or what overlap each other in the exemplary embodiments will be omitted. The terms as used throughout the specification, such as "~ part", "~ module", "~ member", "~ block", etc., may be implemented in software and/or hardware, and a plurality of "~ parts", "~ modules", "~ members", or "~ blocks" may be implemented in a single element, or a single "~ part", "~ module", "~ member", or "~ block" may include a plurality of elements.

It will be further understood that the term "connect" or its derivatives refer both to direct and indirect connection, and the indirect connection includes a connection over a wireless communication network.

It will be further understood that the terms "comprises" and/or "comprising," when used in the present specification, specify the presence of stated features, integers, steps, operations, elements, and/or components, but do not preclude the presence or addition of one or more other features, integers, steps, operations, elements, components, and/or groups thereof, unless the context clearly indicates otherwise.

In the specification, it should be understood that, when a member is referred to as being "on/under" another member, it may be directly on/under the other member, or one or more intervening members may in addition be present.

Although the terms "first," "second," "A," "B," etc. may be used to describe various components, the terms do not limit the corresponding components, but are used only for distinguishing one component from another component.

As used herein, the singular forms "a," "an" and "the" are intended to include the plural forms as well, unless the context clearly indicates otherwise.

Reference numerals used for method steps are just used for convenience of explanation, but not to limit an order of the steps. Thus, unless the context clearly dictates otherwise, the written order may be practiced otherwise.

Hereinafter, the operating principles and embodiments of the present disclosure will be described with reference to the accompanying drawings.

Figure 2:
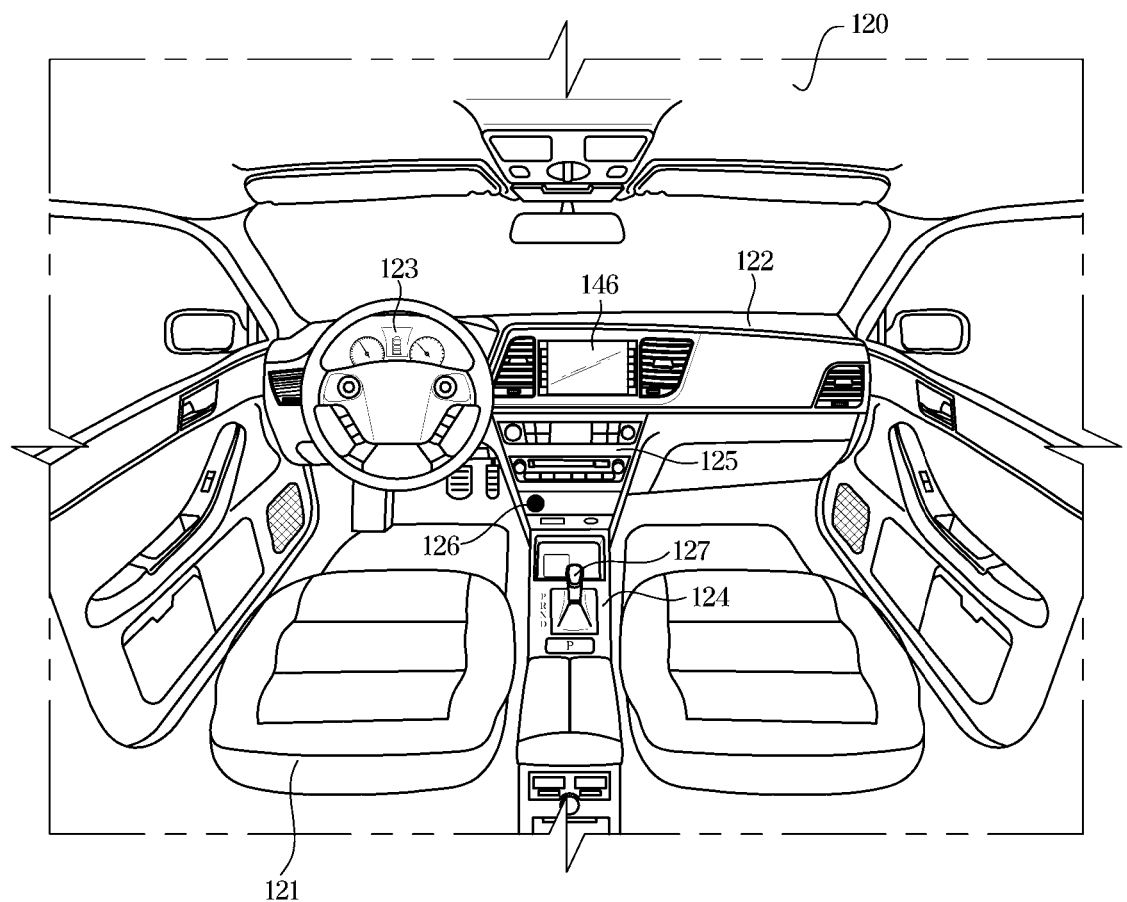
FIG. 2 is a view exemplarily illustrating an interior of a vehicle body according to an exemplary embodiment of the present disclosure.
Figure 3:
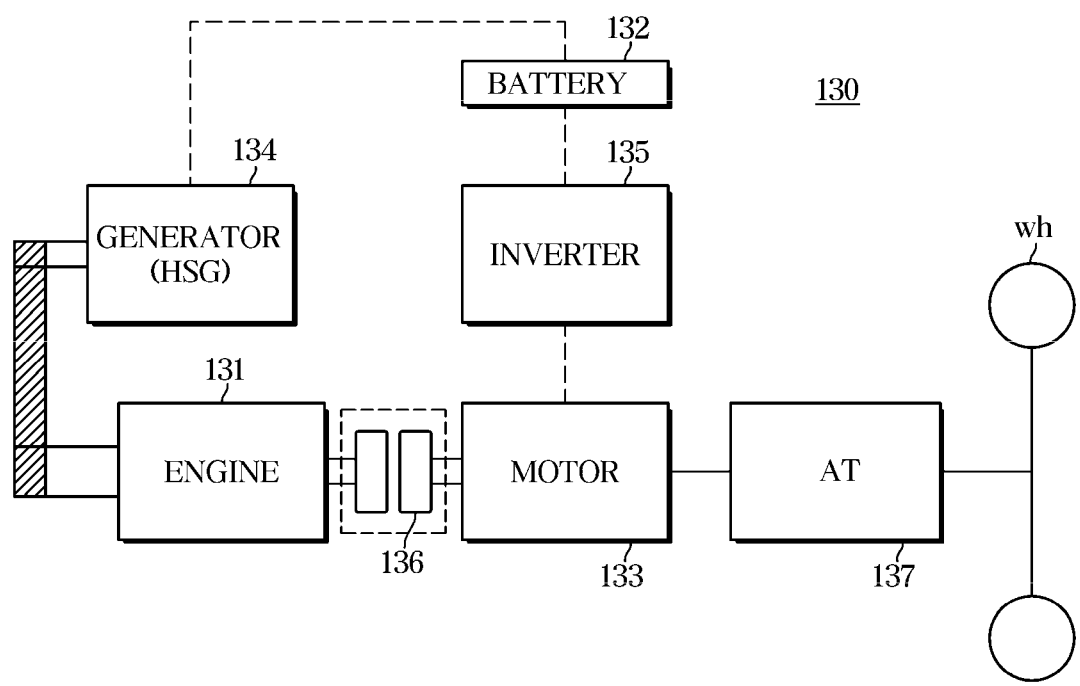
FIG. 3 is a view exemplarily illustrating a chassis of a vehicle according to an exemplary embodiment of the present disclosure.

FIG. 1 is a view exemplarily illustrating an exterior of a vehicle body according to an exemplary embodiment of the present disclosure, FIG. 2 is a view exemplarily illustrating an interior of a vehicle body according to an exemplary embodiment of the present disclosure, and FIG. 3 is a view exemplarily illustrating a chassis of a vehicle according to an exemplary embodiment of the present disclosure.

The vehicle includes an internal combustion engine vehicle (a general engine driven vehicle) that generates mechanical power by burning petroleum fuels, such as gasoline and light oil and travels using the mechanical power, and an eco-friendly vehicle that travels on electricity to enhance the fuel efficiency and reduce toxic gas emissions.

The eco-friendly vehicle includes: an electric vehicle that includes a battery, which is a chargeable power unit, and a motor and operates to rotate the motor the electricity accumulated in the battery and drive vehicle wheels using the rotation of the motor; a hybrid vehicle that includes an engine, a battery, and a motor and travels by controlling the mechanical power of the engine and the electric power of the motor; and a hydrogen fuel cell vehicle.

In the exemplary embodiment of the present disclosure, a hybrid vehicle will be referred to as an example.

The vehicle 1 includes a body including an interior 110 and an exterior 120, and a chassis, which is a portion of the vehicle 1 except for the body, in which mechanical devices required for traveling are provided.

The exterior of the body includes a front panel 111, a bonnet 112, a roof panel 113, a rear panel 114, front, rear, left and right doors 115, and window glasses 116 provided on the front, rear, left and right doors 115 to be openable or closable.

The external 110 of the body includes a side mirror 117 that provides the driver with a rear view of the vehicle 1 and a lamp 118 that allows the driver to easily view surrounding information of the vehicle 1 even while looking to the front and performs signaling to other vehicles and pedestrians and communication with vehicles and pedestrians.

The lamp 118 may be provided on the front and rear surfaces of the exterior of the vehicle, and may include a lamp for illuminating a long distance, a short distance, and a rear side, a lamp for signaling braking, turning direction, and emergency situations, and a lamp for indicating vehicle width, vehicle body height, license plate lighting, and parking.

Referring to FIG. 2, the interior 120 of the body includes a seat 121 on which an occupant sits, a dashboard 122, a cluster 123 disposed on the dashboard 122 and mounting a tachometer, a speedometer, a coolant thermometer, a fuel gauge, a turn indicator, a high-beam light, a warning light, a seat belt warning light, an odometer, an odograph, a shift lever indicator light, a door open warning light, an engine oil notification light, and a low fuel warning light thereon, a center fascia 124 in which a vent and a control panel of an air conditioner are disposed, a head unit 125 provided on the center fascia 124 and configured to receive an operation command of the audio device and the air conditioner, and an ignition button 126 provided on the center fascia 124 and configured to receive an ignition command.

The cluster 123 may include a display panel, and may display failure information in response to a control command of a power management apparatus 200.

In response to a manipulation of the ignition button 126, the vehicle 1 may perform power supply through an accessory signal line, power supply through a first ignition signal line, power supply through a second ignition signal line, and power supply through a third ignition signal line.

The accessory signal line, the first ignition signal line, second ignition signal line, and the third ignition signal line may be divided according to the state of power supply supplied to various electric components or loads provided in the vehicle 1.

The vehicle 1 further includes a shift lever 127 provided on the center fascia 124 and receiving an input of a manipulated position, and a parking button (an electronic parking brake button: an EPB button) located in the vicinity of the shift lever 127 or in the head unit 125 and receiving an input of an operation command of an EPB (now shown) device.

The vehicle 1 further includes an AVN device 146 for user convenience.

The AVN device 146 may be provided on the dashboard in an embedded type or mounted type.

The AVN device 146 may include a display and may further include an inputter.

That is, the AVN device 146 may include only a display panel, or may include a touch screen in which a touch panel is integrated with a display panel.

When the AVN device 146 is implemented with only a display panel, the AVN device 146 receives selection of a button displayed on the display panel using the inputter 127 provided in the head unit.

When the AVN device 146 is implemented as a touch screen, the AVN device 146 may directly receive an operation command of the user through the touch panel.

The AVN device 146 may display failure information in response to a control command from the power management apparatus 200.

The chassis of the vehicle 1 is a frame that supports the body 110 and 120, and the chassis may be provided with wheels Wh disposed at the front, rear, left and right sides thereof, a power device 130 for applying a driving force to the front, rear, left and right vehicle wheels Wh, a steering device, a braking device configured for applying a braking force to the front, rear, left and right vehicle wheels Wh, and a suspension device.

The power device 130 is a device that generates a driving force required for travelling of the vehicle 1 and adjusts the generated driving force.

Referring to FIG. 3, the power device 130 may include an engine 131, a fuel device, a cooling device, a refueling device, a battery 132, a motor 133, a generator 134, an inverter 135, a clutch 136, an automatic transmission (AT) 137, and an axle, and may further include an actuator for driving the clutch 136.

The engine 131 generates mechanical power by burning petroleum fuel, such as gasoline or diesel, and transmits the generated power to the clutch 136.

The battery 132 generates power of a high-voltage current and supplies the generated power to the motor 133, the generator 134, and various electric devices in the vehicle 1.

The battery 132 is charged by receiving power supplied from the generator 134.

The motor 133 generates a rotation force using the electrical energy of the battery 132 and transmits the generated rotation force to the wheels to drive the wheels.

When the motor 133 is connected to the engine 131 by the clutch 136, the motor 133 transmits the rotation force of the engine 131 together with the generated rotation force to the wheels.

The motor 133 converts the electrical energy of the battery 132 into mechanical energy for operating various electric devices provided in the vehicle 1.

The motor 133 may operate as a generator under energy regeneration conditions by braking, deceleration, or low-speed driving to charge the battery 132.

The generator (a hybrid starter generator: HSG, 134) is a starter generator, and connectable to a crankshaft of the engine 131. The generator 134 may, for starting the engine 131 in linkage with the crankshaft of the engine 131, serve as a starting motor and upon the wheels not being driven by the engine 131, serve as a generator and charge the battery 132.

That is, the generator 134 is configured as a generator by the power transmitted through the engine 131 to charge the battery 132.

Furthermore, the vehicle 1 may be supplied with power from a charger disposed in a parking lot or charging station and charge the battery 132 using the supplied power.

The power device 130 of the vehicle 1 further includes a power converting device that converts power generated by the generator 134 into power which is chargeable in the battery 132 and converts power of the battery 132 into driving power of the generator 134. The power converting device may include a converter.

The power converting device may also be configured to change the direction and output of current between the generator 134 and the battery 132.

The inverter 135 converts power of the battery 143 into driving power of the motor 133.

The inverter 134, when outputting the driving power of the motor 133, may output the driving power of the motor 133 based on a target travelling velocity according to a user command. Here, the driving power of the motor 133 may represent a switching signal for outputting a current corresponding to the target travelling velocity and a switching signal for outputting a voltage corresponding to the target travelling velocity.

That is, the inverter 135 may include a plurality of switching elements.

The clutch 136 may be disposed between the engine 131 and the motor 133.

The clutch 136, when generating the driving force of the wheels using the engine 131 and the motor 133, may be closed (closed or locked), and when generating the driving force of the wheels using only the motor 133, may be opened with a spring being pushed by hydraulic pressure generated by driving of the actuator (a hydraulic clutch actuator: HCA).

That is, the clutch 136 is determined to be open or closed according to the driving mode of the vehicle.

The clutch 136 may be opened during decelerating travel or low-speed travel using the motor 133 and may also be opened during braking, and may be closed during climbing, accelerating travel, and constant velocity travel above a certain velocity.

The clutch 136 may be a normal-close type clutch that allows the engine 131 and the motor 133 to be connected when the power of the vehicle is turned off.

Furthermore, the clutch 136 may be a dry type clutch.

The AT 137 transmits the rotation motion of the engine 131 and the motor 133 to the wheels or transmits the rotation motion of the motor 133 to the wheels.

The AT 137 performs optimal torque conversion so that the gear is automatically manipulated based on the vehicle velocity.

The vehicle 1 may further include a differential device provided between the AT 137 and the wheels, and the differential device adjusts the transmission ratio of the AT 137 to generate respective driving forces for the left and right wheels, and transmits the generated respective driving forces to the left and right wheels.

In the power device of the vehicle According to the exemplary embodiment of the present disclosure, the engine 131 and the motor 133 are connected to the axle of the vehicle 1 to form a parallel structure in which the engine 131 and the motor 133 simultaneously drive the vehicle 1.

The vehicle, when driven only with the motor 133 (an electric vehicle (EV) mode or a series mode), allows the clutch 136 to be opened so that the motor 133 and the engine 131 are not mechanically connected and thus the rotation of the motor 133 is directly transmitted to the AT 137, in which case, the engine 131 may be in a drive-off state, and upon charging of the battery, set into a drive on-state.

Furthermore, the vehicle 1, when driven with the engine 131 and the motor 133 operating together (a hybrid electric vehicle (HEV) mode), allows the clutch 136 to be closed so that a power of the rotation force of the engine 131 plus the rotation force of the motor 133 is transmitted to the AT 137.

Furthermore, the vehicle 1, when driven only with the engine 131, allows the clutch 136 to be closed so that the engine 131 is connected to the axle and rotated with the motor 133.

The vehicle 1 may include various electric components 140 for controlling the vehicle 1 and for the safety and convenience of occupants as well as the mechanical components described above.

Figure 4:
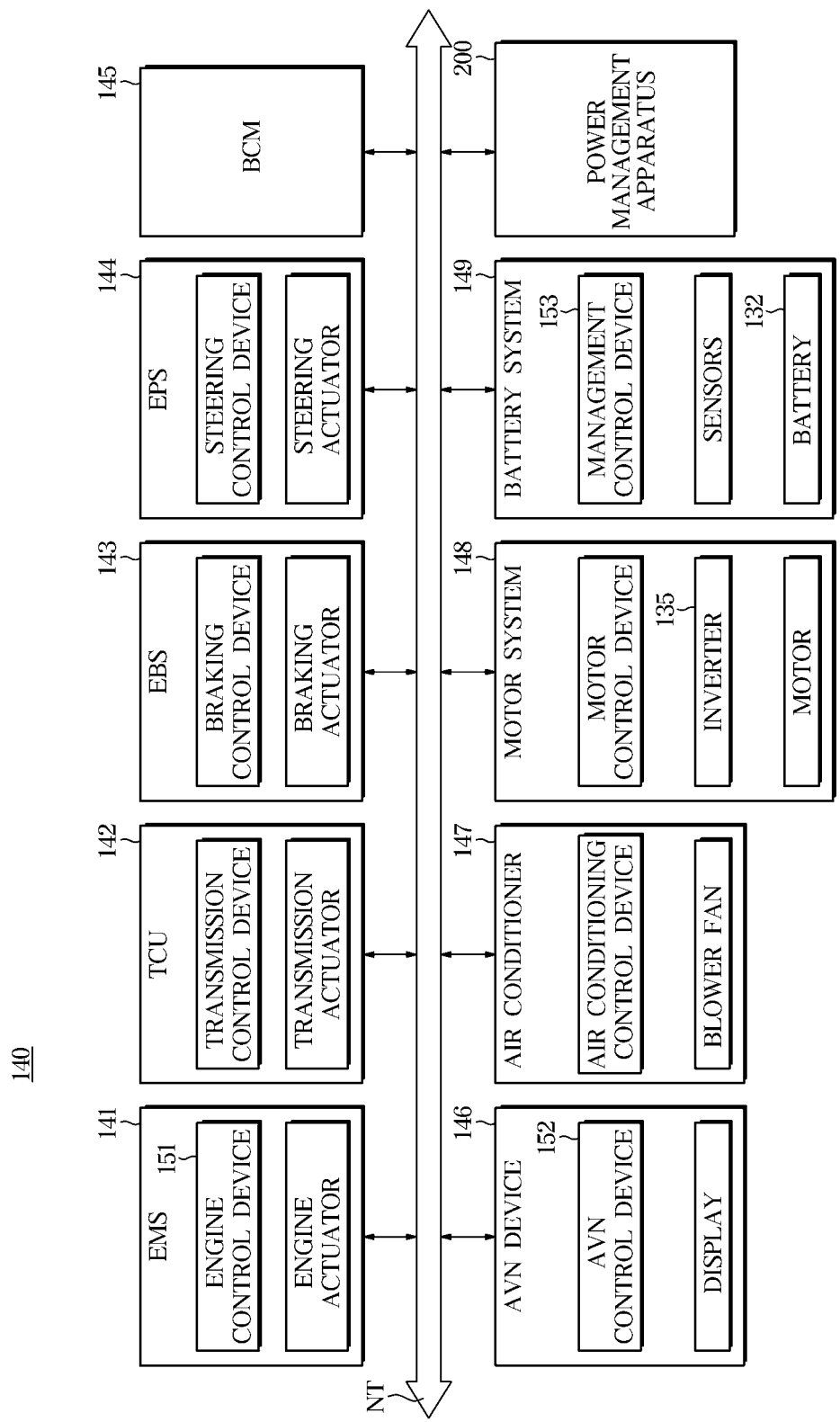
FIG. 4 is a view exemplarily illustrating electric components of a vehicle according to an exemplary embodiment of the present disclosure.

Referring to FIG. 4, the vehicle 1 includes an engine management system (EMS) 141, a transmission control unit (TCU) 142, an electronic braking system (EBS) 143, an electronic power steering (EPS) 144, a body control module (BCM) 145, an audio-video-navigation (AVN) device 146 providing various types of information and entertainment to the driver through sound and video, an air conditioner (heating/ventilation/air conditioning, HVAC) 147 for controlling the inflow of air from outside the vehicle 1 or heating or cooling the indoor air according to the indoor temperature of the vehicle 1, a motor system 148, and a battery system 149, as well as the power management apparatus 200.

The EMS 141 may control an operation of the engine 131 and manage the engine 131 in response to an acceleration command of the driver through an accelerator pedal. The EMS 141 includes an engine actuator including a throttle valve for controlling a mixed gas injected into the engine 131, and an engine control device (an electric control unit ECU) 151 for controlling the engine actuator.

The BCM 145 may control the operation of electric components that provide convenience to the driver or ensure the driver's safety.

The BCM 145 may control a door lock device, a lamp, a wiper, a power seat, a seat heater, a cluster, an interior lamp, a tailgate, etc. provided in the vehicle 1.

Furthermore, the BCM 145 may include separate ECUs for controlling the door lock device, the lamp, the wiper, the power seat, the seat heater, the cluster, the interior lamp, and the tailgate, respectively.

The AVN device 146 may include an AVN control device 152 for performing at least one of an audio mode, a video mode, a navigation mode, a broadcast mode (a digital audio broadcasting (DMB) function), or a radio mode. The AVN device 146 may include a display, may further include an inputter, and may further include a speaker.

The battery system 149 may obtain state information related to the battery 132. The battery system 149 may include a plurality of sensors that collect pieces of information related to the state of the battery 132, such as an output voltage of the battery 132, an input/output current of the battery 132, and a temperature of the battery 132. Furthermore, the battery system 149 may include a management control device 153 for determining a state of charge (SoC) and a life (state of health, SoH) of the battery 132 based on the information related to the state of the battery 132 and managing the SOC and SoH of the battery 132.

The power management apparatus 200 may divide the electric components 140 included in the vehicle 1 into a plurality of groups according to the arrangement position (i.e., a zone) (see FIG. 1).

The power management apparatus 200 may monitor the voltage of the battery 132 to determine a failure in power supply of the battery 132, and determine a failure for each power signal line.

The power management apparatus 200 may determine a failure in power supply of each power signal line in each zone.

When the zones of the vehicle 1 are divided into zone A, zone B, zone C, and zone D, the power management apparatus 200 may divide control devices present in zone A into control devices for receiving power through the accessory signal line, control devices for receiving power through the first ignition signal line, control devices for receiving power through the second ignition signal line, and control devices for receiving power through the third ignition signal line, and may set one of the control devices for each power signal line as a master control device.

Here, among the control devices present in the A zone, the control devices receiving power through the accessory signal line are set into one group, and the control devices receiving power through the first ignition signal line are set into another group.

For example, one of the control device receiving power through the first ignition signal line may be set as a first master control device, one of the control devices receiving power through the accessory signal line may be set as a second master control device, one of the control devices receiving power through the third ignition signal line may be set as a third master control device, and one of the control device receiving power through the second ignition signal line may be set as a fourth master control device.

In the present manner, the power management apparatus 200 may set the first master control device, the second master control device, the third master control device, and the fourth master control device for each zone from the control devices present in zone B, zone C, and zone D.

The power management apparatus 200 may determine the state of the vehicle 1 and the failure in power supply for each power signal line based on pieces of power information supplied to the master control devices for each zone.

The power management apparatus 200 may select one master control device in each zone so that one master control devices supplied with power through different power signal lines are selected between the zones, and based on voltage information applied to each of the selected master control devices, determine the state of the vehicle and the failure in power supply of each power signal line.

For example, the power management apparatus 200 may select first master control device 151 receiving power through the first ignition signal line IG1 in zone A, a second master control device 152 receiving power through the accessary signal line ACC in zone B, a third master control device 153 receiving power through the third ignition signal line IG3 in zone C, and a fourth master control device 154 receiving power through the second ignition signal line IG2 in zone D, The power management apparatus 200 may determine the state of the vehicle and the failure in power supply of each power signal line based on voltage information applied to the first, second, third, and fourth master control devices 151 to 154.

The electric components 140 may communicate with each other through a vehicle communication network NT. For example, the electric components 140 may include exchange data through Ethernet, media oriented systems transport (MOST), Flexray, controller area network (CAN), local interconnect network (LIN), etc.

Hereinafter, the power management apparatus 200 will be described in detail with reference to FIG. 5, FIG. 6 and FIG. 7.

Figure 5:
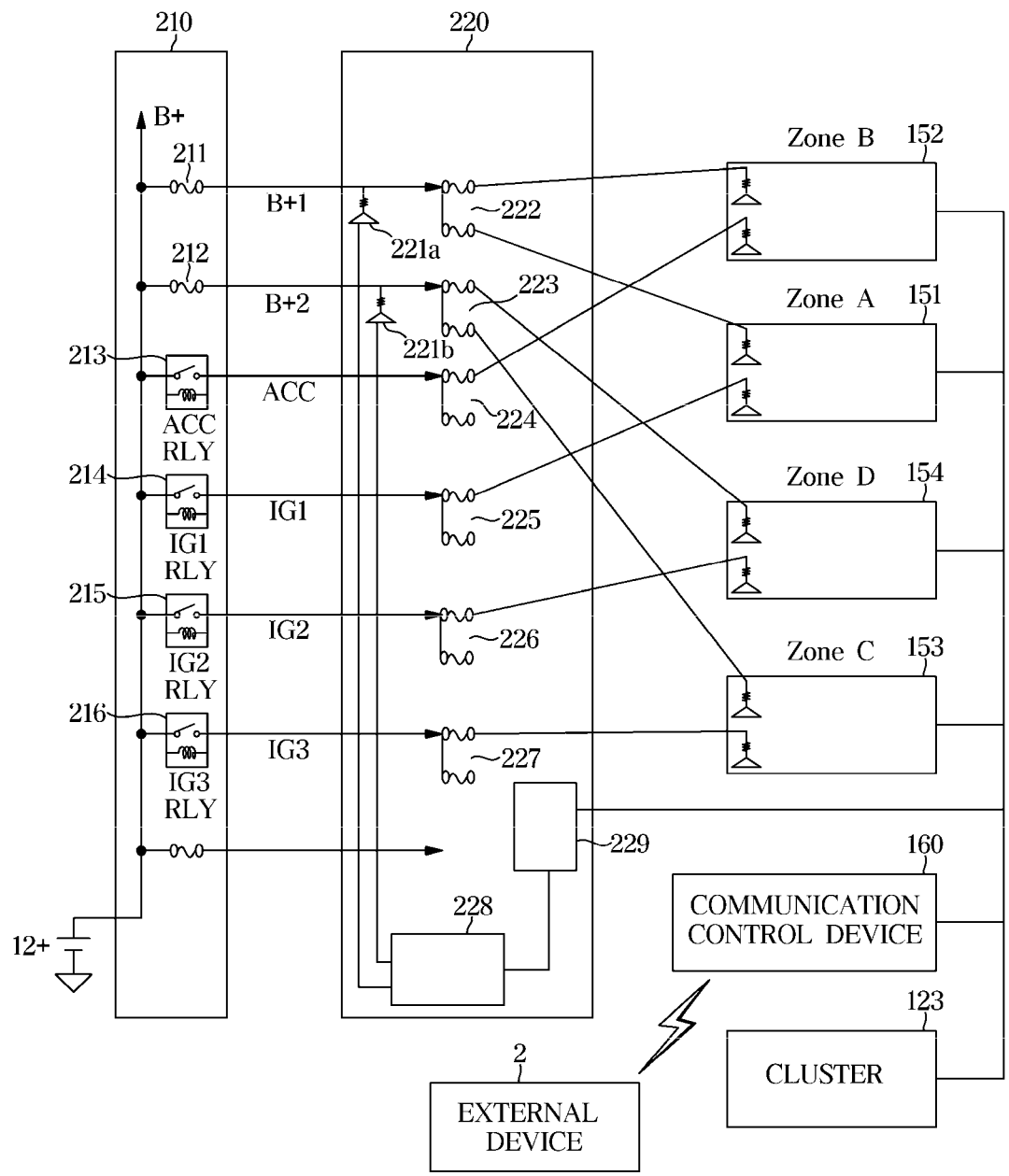
FIG. 5 is a block diagram illustrating a power management apparatus according to an exemplary embodiment of the present disclosure.

FIG. 5 is a block diagram illustrating a power management apparatus according to an exemplary embodiment of the present disclosure.

The power management apparatus 200 includes a power distributing device 210 and a power control device 220.

The power distributing device 210 includes a plurality of switches 211 to 216.

The plurality of switches may be turned on or off.

The plurality of switches may include first and second switches 211 and 212 for supplying power from the battery 132.

The first switch 211 is connected to the battery 132 and supplies power of the battery 132 to the power control device 220 through a first main signal line B+1.

The second switch 212 is connected to the battery 132 and supplies power from the battery 132 to the power control device 220 through a second main signal line B+2.

The magnitude of the power of the battery 132 supplied through the first main signal line B+1 may be the same as or different from the magnitude of the power of the battery 132 supplied through the second main signal line B+2.

Although the exemplary embodiment of the present disclosure is illustrated as including two main signal lines in the power distributing device, the power distributing device may be provided with a single main signal line.

The plurality of switches may further include a third switch 213 for supplying power to the power control device 220 through the accessory signal line ACC, a fourth switch 214 for supplying power to the power control device 220 through the first ignition signal line IG1, a fifth switch 215 for supplying power to the power control device 220 through the second ignition signal line IG2, and a sixth switch 216 for supplying power to the power control device 220 through the third ignition signal line IG3. Here, the third, fourth, fifth and sixth switches 213, 214, 215, and 216 may include relays.

The accessory signal line ACC, the first ignition signal line IG1, the second ignition signal line IG2, and the third ignition signal line IG3 may be divided according to a state of power supply.

For example, the state of power supply may include a time point at which power is supplied, an amount of power required to drive a load, and a function of a load to be supplied with power.

The electric components and the control device provided in each electric component may be supplied with power through power signal lines device divided according to the time point at which power needs to be supplied, the amount of power required for driving, and the function of a load provided therein.

The power control device 220 selects the master control devices not only connected to the main signal directly connected to the battery 132 but also respectively connected to the accessory signal line ACC, the first ignition signal line IG1, the second ignition signal line IG2, and the third ignition signal line IG3, in the zones.

The power control device 220 may perform monitoring based on voltage information received from the plurality of master control devices, and in response to a result of the monitoring, control power supply for each load, voltage variation for each load, and the like.

The power control device 220 may determine whether there is a failure in power supply of the plurality of master control devices, identify the power signal line of the master control device determined to be failed due to power supply, identify control devices receiving power through the identified power signal line, and determine that the identified control devices are failed due to power supply. The power control device 220 may control deactivation of the control devices determined to be failed due to power supply.

The power control device 220 may transmit failure information through an external server or a user terminal through a communication control device 160 for the user to check the failure.

The power control device 220 may determine whether the vehicle 1 is in a parked state, a stopped state, or a travelling state based on voltage information received through each master control device.

The power control device 220 may control power supply of electric components in response to the state of the vehicle 1.

The power control device 220 includes a first voltage sensor 221a connected to the first switch 211 and detecting the voltage of the battery 132 applied through the first main signal line B+1, and a second voltage sensor 221b connected to the second switch 212 and detecting the voltage of the battery 132 applied through the second main signal line B+2.

The power control device 220 includes a plurality of interfaces.

The plurality of interfaces includes a first interface 222 connected to the first switch 211 of the power distributing device 210 through the first main signal line B+1, a second interface 223 connected to the second switch 212 of the power distributing device 210 through the second main signal line B+2, a third interface 224 connected to the third switch 213 of the power distributing device 210 through the accessary signal line ACC, a fourth interface 225 connected to the fourth switch 214 of the power distributing device 210 through the first ignition line IG1, a fifth interface 226 connected to the fifth switch 215 of the power distributing device 210 through the second ignition line IG2, and a sixth interface 227 connected to the sixth switch 216 of the power distributing device 210 through the third ignition line IG3.

The first interface 222 may branch the first main signal line B+1 into a plurality of first main signal lines. In the instant case, the branched first main signal lines may be connected to a plurality of master control devices.

The second interface 223 may branch the second main signal B+2 line into a plurality of second main signal lines. In the instant case, the branched second main signal lines may be connected to a plurality of master control devices.

Each of the interfaces may include one or more switches.

The first voltage sensor 221a may be connected to the first interface 222, and the second voltage sensor 221b may be connected to the second interface 223.

That is, the first voltage sensor 221a may detect the voltage of the battery 132 supplied to the first interface 222, and the second voltage sensor 221b may detect the voltage of the battery 132 supplied to the second interface 223.

The first voltage sensor 221a and the second voltage sensor 221b may be connected to a first processor 228.

The first interface 222 may be connected to master control devices provided in some zones among the plurality of master control devices.

The second interface 223 may be connected to master control devices provided in the remaining zones among the plurality of master control devices.

For example, the first interface 222 may be connected to master control devices provided in a zone of a front side of the body of the vehicle 1, and the second interface 223 may be connected to master control devices provided in a zone of a rear side of the body of the vehicle 1.

The third interface 224, the fourth interface 225, the fifth interface 226, and the sixth interface 227 may be connected to master control devices provided in respective zones.

The power control device 220 further includes the first processor 228 and a first communicator 229 connected to the first processor 228 and performing communication with the first processor 228 and various electric components provided in the vehicle 1. The first processor 228 and the first communicator 229 of the power control device 220 will be described below with reference to FIG. 6.

Each master control device may be connected to the first interface 222 or the second interface 223.

Each master control device may be connected to one of the third to sixth interfaces.

For example, the first master control device 151 provided in zone A may be connected to the first interface 222 and the third interface 224. The second master control device 152 provided in zone B may be connected to the first interface 222 and the fourth interface 225. The third master control device 153 provided in zone C may be connected to the second interface 223 and the sixth interface 227. The fourth master control device 154 provided in zone D may be connected to the second interface 223 and the fifth interface 226.

Each master control device may include a third voltage sensor configured for detecting a voltage of the battery 132 applied through the first main signal line B+1 or the second main signal line B+2, and a fourth voltage sensor configured for detecting a voltage applied through one of the power signal lines.

Each master control device may further include a second processor and a second communicator that performs communication between the second processor and the power control device 220, and performs communication with the second processor and the cluster 123 or the AVN device 146.

The configuration of the master control device will be described below with reference to FIG. 7.

The communication control device 160 may include one or more components that enable communication with an external device 2 and between components inside the vehicle 1, for example, at least one of a short-range communication module, a wired communication module, or a wireless communication module. Here, the external device 2 may include a server that provides an application for a vehicle manufacturer, a vehicle maintenance center, or a vehicle maintenance, and may include a remote control device, and may include a user terminal.

The short-range communication module may include various short-range communication modules that transmit and receive signals using a wireless communication network in a short range, such as a Bluetooth module, an infrared communication module, a radio frequency identification (RFID) communication module, a wireless local access network (WLAN) communication module, an NFC communication module, and a ZigBee communication module.

The wired communication module may include various wired communication modules, such as a local area network (LAN) module, a wide area network (WAN) module, or a value added network communication (VAN) module, and various cable communication modules, such as a universal serial bus (USB) module, a high definition multimedia interface (HDMI) module a digital visual interface (DVI) module, a recommended standard-232 (RS-232) module, a power line communication module, or a plain old telephone service (POTS) module.

The wired communication module may further include a local interconnect network (LIN).

The wireless communication module may include wireless communication modules supporting various wireless communication methods, such as a Wifi module, a wireless broadband module (Wibro) module, a global system for mobile communication (GSM) module, a code division multiple access (CDMA) module, a wideband code division multiple access (WCDMA) module, a universal mobile telecommunications system (UMTS) module, a time division multiple access (TDMA) module, a more than a long term evolution (LTE) module, an ultra-wide band (UWB), and the like.

Figure 6:
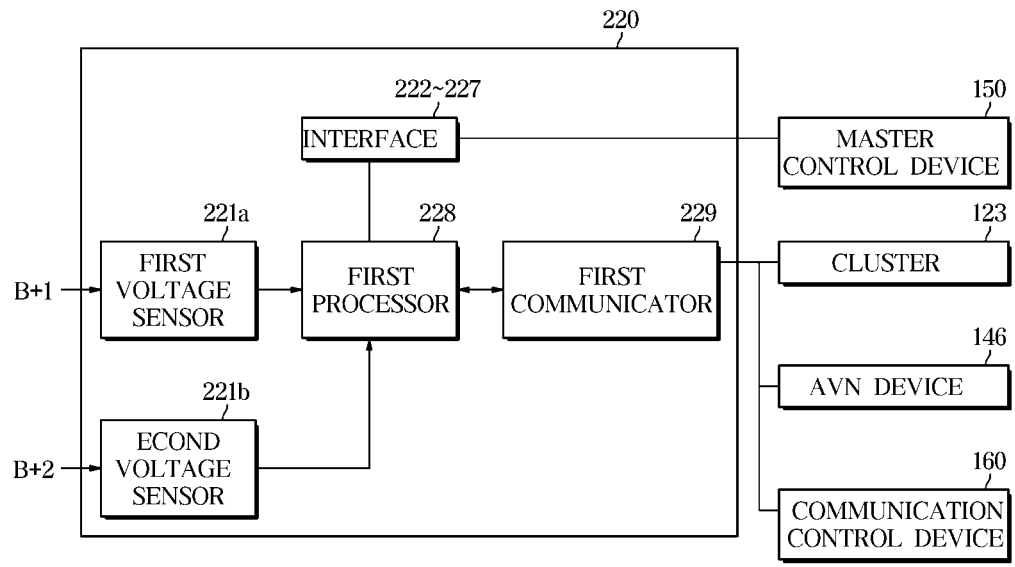
FIG. 6 is a block diagram illustrating a power control device provided in a power management apparatus according to an exemplary embodiment of the present disclosure.

FIG. 6 is a block diagram illustrating a power control device provided in a power management apparatus according to an exemplary embodiment of the present disclosure.

The power control device 220 includes the first voltage sensor 221a, the second voltage sensor 221b, the plurality of interfaces 222 to 227, the first processor 228, and the first communicator 229.

The first voltage sensor 221a detects the voltage of the battery 132 applied through the first main signal line B+1 and transmits first voltage information related to the detected voltage of the battery 132 to the first processor 228.

The second voltage sensor 221b detects the voltage of the battery 132 applied through the second main signal line B+2 and transmits second voltage information related to the detected voltage of the battery 132 to the first processor 228.

Furthermore, when there is only one main signal line, the power control device 220 may also be provided with a single voltage sensor.

The plurality of interfaces 222 to 227 have been described above with reference to FIG. 5, and the same descriptions will be omitted.

The first processor 228 may, upon a remote control signal being received when the ignition is in an OFF state (i.e., a key-off state), transmit a wake-up signal to the plurality of master control devices.

That is, the first processor 228 may, upon the remote control signal being received in an ignition-off state (i.e., a key-off state), determine that the current time is a failure diagnosis time.

The remote control signal is a signal received from a remote control device, a user terminal, or a server, and may include a door unlock signal and an ignition-on signal.

The first processor 228 may determine whether a failure in power supply of the battery 132 has occurred, in the ignition-off state (i.e., in a key-off state).

The first processor 228 may receive voltage information from the plurality of master control devices that are woken up.

The first processor 228 may determine whether the accessory signal line and the first, second, and third ignition signal lines fail in a state in which power is supplied through the plurality of power signal lines and the vehicle is stopped.

The first processor 228 may determine whether the accessory signal line and the first, second, and third ignition signal lines fail in a state in which the engine is running or the vehicle travels in a low voltage state.

The first processor 228 determines the state of the vehicle 1 based on the voltage information received from the plurality of master control devices. Here, the state of the vehicle may include a parked state, a stopped state, and a travelling state.

The first processor 228 receives voltage information of the main signal line and voltage information of the power signal line from the plurality of master control devices, and determine the state of the vehicle 1 based on the received voltage information of the main signal line and the received voltage information of the power signal line.

The first processor 228 may, if neither the voltage of the first ignition signal line nor the voltage of the accessory signal line exists (i.e., zero (0)) based on the voltage information of the power signal line, determine that the vehicle 1 is in a parked state, and if the voltage of the first ignition signal line does not exist and the voltage of the accessory signal line exists, determine that the vehicle 1 is in a stopped state. Here, the stopped state may be a stopped state in a key-off state.

Furthermore, the stopped state in the key-off and the parked state may be a state in which power from the battery 132 is supplied to electric components.

The existence of a voltage of the accessory signal line represents a state in which the voltage of the accessory signal line has a voltage greater than zero and less than or equal to a normal state.

The first processor 228 may, if the voltage of the first ignition signal line exists, the voltage of the accessory signal line exists, and the travelling velocity of the vehicle 1 is 0, determine the vehicle 1 is in a temporarily stopped state, and if the voltage of the first ignition signal line exists, the voltage of the accessory signal line exists, and the travelling velocity is not 0, determine that the vehicle is in a travelling state.

Here, the temporarily stopped state may represent a state in which the vehicle 1 is stopped for a certain time period during travel, that is, a stopped state in a key-on state.

The first processor 228 may determine whether there is a failure in power supply of the battery 132 or whether there is a failure in power supply through the power signal line to correspond to the state of the vehicle 1. For example, if the vehicle 1 is parked or stopped in a key-off state, the first processor 228 may determine whether there is a failure in power supply of the battery 132, and if the vehicle 1 is stopped in a key-on state or driving, the first processor 228 may determine whether there is a failure in power supply through the accessary line, and first, second, and third ignition signal lines.

The first processor 228 may, when the vehicle is in a stopped state or a parked state, determine whether there is a failure in power supply of the battery 132 based on the first voltage information transmitted from the first voltage sensor 221a and the second voltage information transmitted from the second voltage sensor 221b, and upon determining that the power supply of the battery 132 is normal, control power supply to the plurality of control devices provided in the vehicle 1.

The first processor 228 may, when the vehicle 1 is in a stopped state or a parked state, determine whether the first voltage of the battery 132 applied through the first main signal line is within a first reference voltage range based on the first voltage information transmitted from the first voltage sensor 221a, and if it is determined that the first voltage is within the first reference voltage range, determine that the power supply of the battery 132 through the first main signal line is in a normal state, and if it is determined that the first voltage is lower than a first reference voltage, determine that there is a discharge of the battery 132 or a failure in power supply through the first main signal line.

The first processor 228 may, when the vehicle 1 is in a stopped state or a parked state, determine whether the second voltage of the battery 132 applied through the second main signal line is within the first reference voltage range based on the second voltage information transmitted from the second voltage sensor 221b, and if it is determined that the second voltage is in the first reference voltage range, determine that the power supply of the battery 132 through the second main signal line is in a normal state, and if it is determined whether the second voltage is less than the first reference voltage, determine that there is a discharge of the battery 132 or a failure in power supply through the second main signal line.

For example, the first reference voltage range may be a voltage range of approximately 9V to 16V, and the first reference voltage may be 9V.

The first processor 228 may, if it is determined there is a discharge of the battery 132 or a failure in the first main signal line or the second main signal line, control the first communicator 229 to transmit failure information related to the power supply of the battery 132 to at least one of the cluster 123, the AVN device 146 or the communication control device 160.

The first processor 228 may, if it is determined that there is a plurality of pieces of failure information of power supply, determine a priority on the plurality of pieces of failure information and display the failure information based on the determined priority.

The first processor 228 may display the failure information with the highest priority first, and may display the failure information with the highest priority in a color or thickness different from those of the remaining pieces of failure information.

The first processor 228 may display the failure information using the cluster or the AVN device if the vehicle 1 is in a stopped state with the key-off or is in a parked state, and may transmit the failure information to the server and the user terminal if the vehicle 1 is in a stopped state with the key-on or is in a travelling state.

As described above, the failure information related to the power supply may be notified to the user through the server or may be directly transmitted to the user terminal so that the user recognizes the failure information and rapidly respond to the failure.

The first communicator 229 may include a CAN communication module.

The first communicator 229 performs communication between the first processor 228 and at least one of the cluster 123, the AVN device 146, or the communication control device 160.

The first communicator 229 may transmit, to at least one of the cluster 123, the AVN device 146, or the communication control device 160, information related to the control device determined as a failure state in response to a control command of the first processor 228.

The first communicator 229 may communicate with the plurality of master control devices 151 to 154 and transmit voltage information transmitted from the plurality of master control devices to the first processor 228.

The components shown in FIG. 6 may refer to a software component and/or a hardware component, such as a Field Programmable Gate Array (FPGA) and an Application Specific Integrated Circuit (ASIC).

At least one component may be added or omitted to correspond to the performance of the components of the power control device shown in FIG. 6. Furthermore, the mutual positions of the components may be changed to correspond to the performance or structure of the system.

Figure 7:
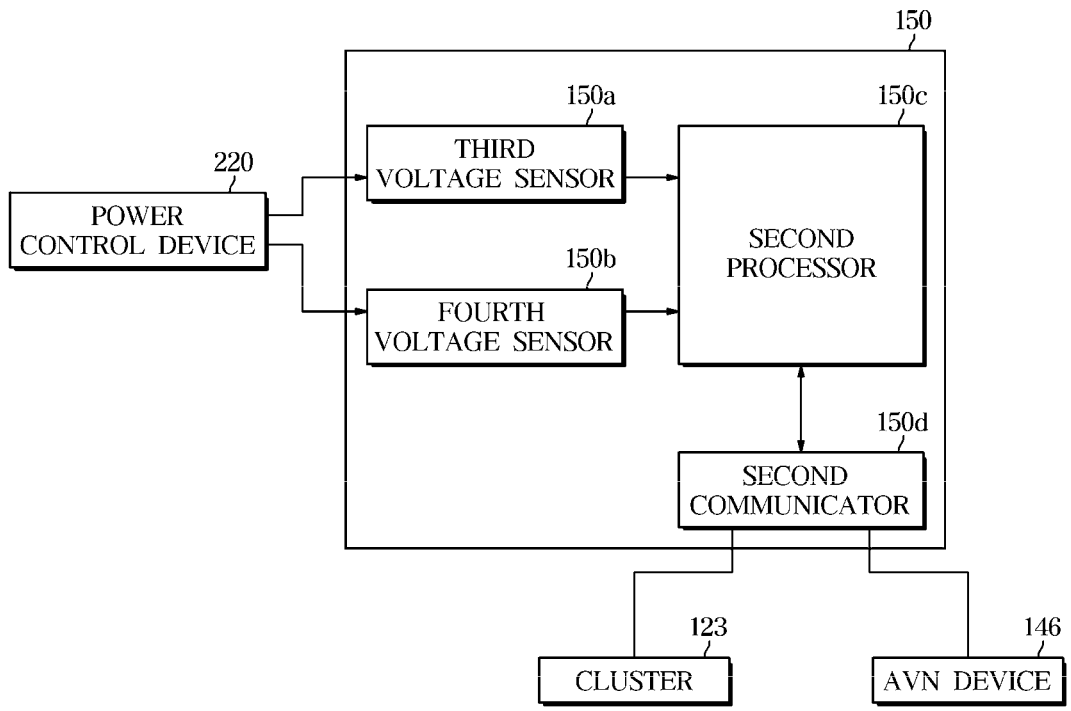
FIG. 7 is a block diagram illustrating a master control device communicating with a power control device provided in a power management apparatus according to an exemplary embodiment of the present disclosure.

FIG. 7 is a block diagram illustrating a master control device communicating with a power control device provided in a power management apparatus according to an exemplary embodiment of the present disclosure.

The plurality of master control devices may monitor power of the battery 132, monitor power received through the power signal line, and transmit the monitored information to the power control device 220.

The plurality of master control devices performing such power monitoring have the same control configuration. Accordingly, one master control device 150 will be described as an example.

The master control device 150 includes a third voltage sensor 150a, a fourth voltage sensor 150b, a second processor 150c, and a second communicator 150d.

The third voltage sensor 150a detects a voltage of the power of the battery 132 and transmits third voltage information regarding the detected voltage to the second processor 150c.

The third voltage sensor 150a may be connected to the first interface 222 or the second interface 223.

The third voltage sensor 150a may, when connected to the first interface 222, detect the first voltage of the battery 132 through the first main signal line B+1.

The third voltage sensor 150a, when connected to the second interface 223, may detect the second voltage of the battery 132 through the second main signal line B+2.

Here, the first voltage and the second voltage of the battery may be the same as or different from each other.

The fourth voltage sensor 150b is connected to one of the third interface 224, the fourth interface 225, the fifth interface 226, and the sixth interface 227, detects a voltage of power supplied through a power signal line matching with the connected interface, and transmits fourth voltage information related to the detected voltage to the second processor 150c.

Here, the power signal may be one of an accessory signal, a first ignition signal, a second ignition signal, and a third ignition signal.

For example, the fourth voltage sensor 150a, when connected to the third interface 224, may detect a voltage applied through the accessory signal line.

The fourth voltage sensor 150a, when connected to the fourth interface 225, may detect a voltage applied through the first ignition signal line.

The fourth voltage sensor 150a, when connected to the fifth interface 226, may detect a voltage applied through the second ignition signal line.

The fourth voltage sensor 150a, when connected to the sixth interface 227, may detect a voltage applied through the first ignition signal line.

The second processor 150c determines whether there is a failure in power of the battery 132 based on the third voltage information detected by the third voltage sensor.

The second processor 150c determines whether the voltage of the battery 132 is less than the first reference voltage based on the third voltage information, and upon determining that the voltage of the battery 132 is within the first reference voltage range, determine that the power supply of the battery 132 through the main signal line is in a normal state, and upon determining that the voltage of the battery 132 is less than the first reference voltage, determine that the power supply of the battery 132 through the main signal line is in a failure state.

The second processor 150c determines whether there is a failure in power supply applied through the power signal line based on the fourth voltage information detected by the fourth voltage sensor.

The second processor 150c determines whether the voltage applied through the power signal line is less than a second reference voltage based on the fourth voltage information, and upon determining that the voltage applied through the power signal line is within a second reference voltage range, determine that the power supply applied through the power signal line is in a normal state, and upon determining that the voltage applied through the power signal line is less than the second reference voltage, determine that power supply through the power signal line is in a failure state.

For example, the second reference voltage range may be approximately 9V to 16V, and the second reference voltage may be approximately 9V.

The second processor 150c may determine whether there is a failure in power supply of the battery 132 and may determine whether there is a failure in power supply applied through the power signal line.

The second processor 150c may transmit failure information regarding power supply to the power control device 220 and may transmit the failure information to at least one of the cluster or the AVN device.

The second processor 150c may also transmit the third voltage information and the fourth voltage information to the power control device 220.

The second processor 150c may control deactivation or activation in response to a control command from the power control device 220.

The second processor 150c may transmit a deactivation command to control devices belonging to the same group in response to a control command from the power control device 220.

The second communicator 150d may communicate with at least one of the power control device 220, the cluster, or the AVN device, and may communicate with control device belonging to a same group.

The second communicator 150d may include a CAN communication module.

The components shown in FIG. 7 may refer to a software component and/or a hardware component, such as a Field Programmable Gate Array (FPGA) and an Application Specific Integrated Circuit (ASIC).

At least one component may be added or omitted to correspond to the performance of the components of the master control device shown in FIG. 7. Furthermore, the mutual positions of the components may be changed to correspond to the performance or structure of the system.

Figure 8A:
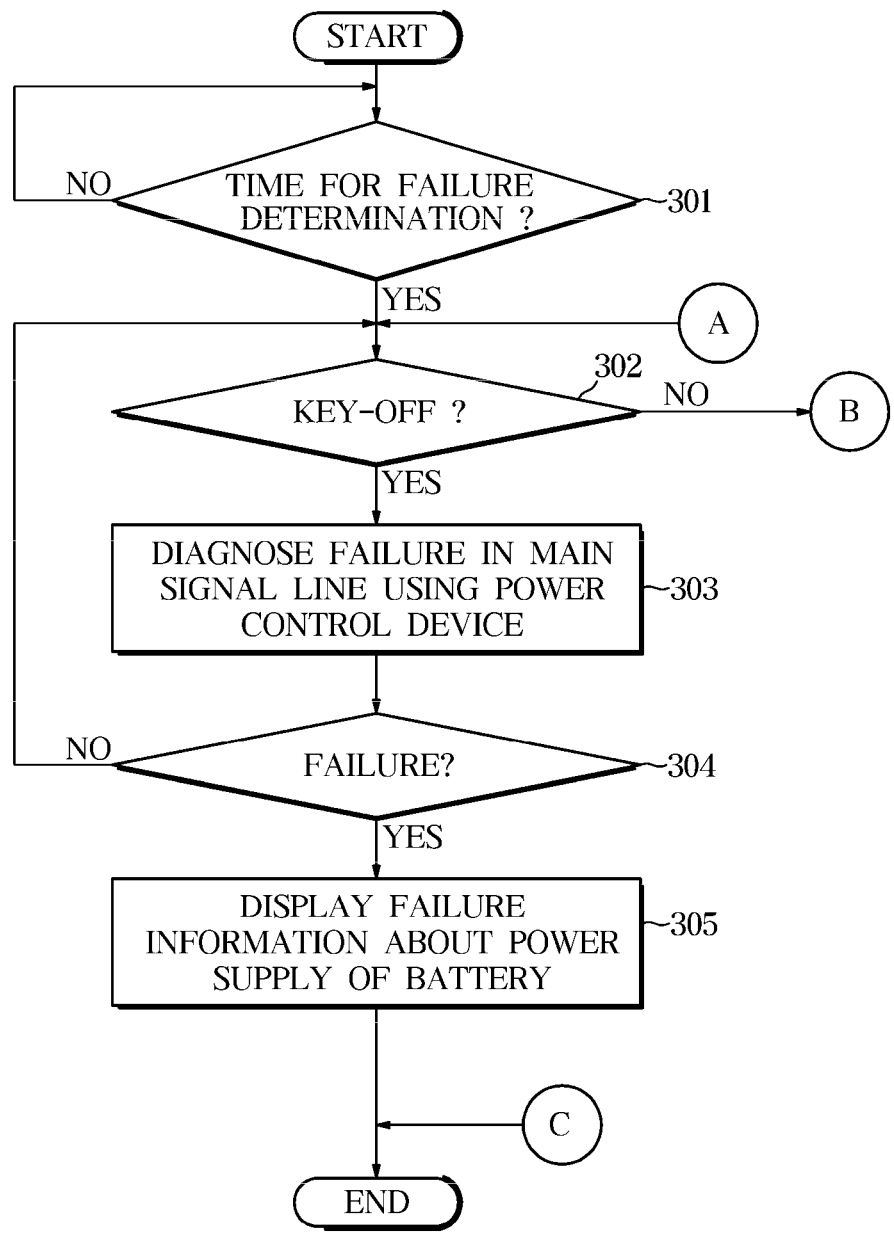
FIG. 8A and FIG. 8B are a control flowchart of a vehicle according to an exemplary embodiment of the present disclosure.
Figure 8B:
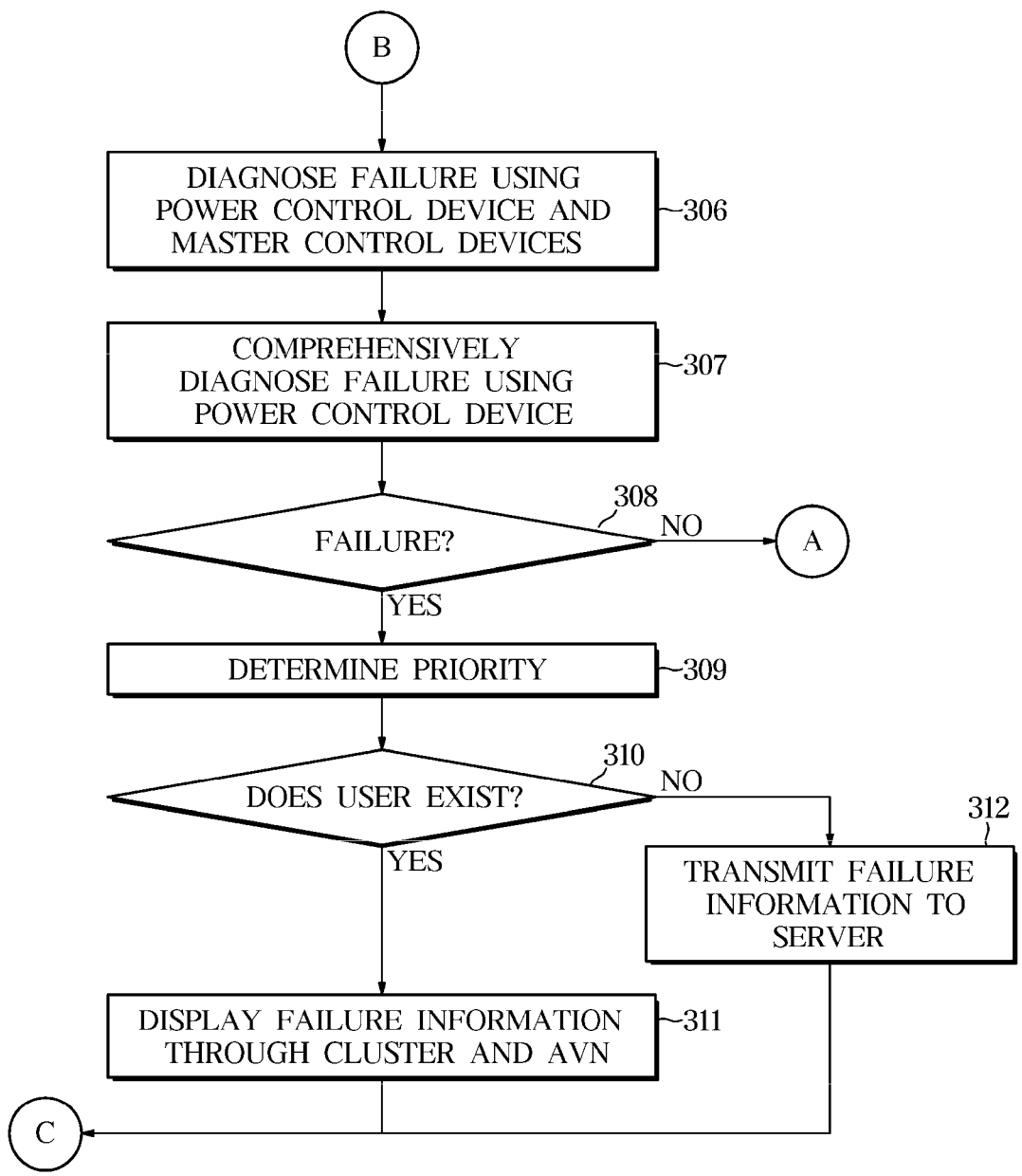

FIG. 8A and FIG. 8B are a control flowchart of a vehicle according to an exemplary embodiment of the present disclosure. The following description will be made in conjunction with FIG. 9.

The vehicle determines whether the current time point is a failure determination time (301).

The determining whether the current time point is a failure determination time point may include determining whether a remote control signal is received. Here, the remote control signal is a signal received from a remote control device, a user terminal, or a server, and may include a door unlock signal and an ignition-on signal.

The vehicle may, upon determining that the current time point is a failure determination time point, determine whether the vehicle is in a key-off state (i.e., an ignition-off state) (302), and upon determining that the vehicle is in a key-off state, transmit a wake-up signal to the power management apparatus 200 so that the power control device 220 of the power management apparatus 200 and the plurality of master control devices are switched from a sleep mode to a wake-up mode.

The vehicle supplies power from the battery to the plurality of master control devices through the power control device 220.

The vehicle may, in response to the power management apparatus 200 being woken up, use the power control device 220 to diagnose whether there is a failure in power supply of the battery 132 through the main signal line (303), and diagnose whether there is a failure in power supply of the battery 132 through the main signal lines connected to the plurality of master control devices.

The vehicle obtains the first voltage information detected by the first voltage sensor 221a provided in the power control device 220 and the second voltage information detected by the second voltage sensor 221b, and based on the obtained first voltage information and the obtained second voltage information, determine whether there is a failure in power supply of the battery 132, and upon determining that the power supply of the battery 132 is normal, control power supply to the plurality of control devices provided in the vehicle.

The vehicle may, when diagnosing a failure in power supply of the battery 132, determine whether the first voltage of the battery 132 applied through the first main signal line is within the first reference voltage range based on the first voltage information, and upon determining that the first voltage is within the first reference voltage range, determine that the power supply of the battery 132 through the first main signal line is in a normal state, and upon determining that the first voltage is less than the first reference voltage, determine that there is a discharge of the battery 132 or a failure in power supply through the first main signal line.

The vehicle may determine whether the second voltage of the battery 132 applied through the second main signal line is within the first reference voltage range based on the second voltage information, and upon determining that the second voltage is within the first reference voltage range, determine that the power supply of the battery 132 through the second main signal line is in a normal state, and upon determining that the second voltage is less than the first reference voltage, determine that there is a discharge of the battery 132 or a failure in power supply through the second main signal line.

As shown in FIG. 9, the vehicle may, upon determining that the that the power supply through the first main signal line and the power supply through the second main signal line are in a failure state, determine that there is a discharge or failure in the battery 132.

The vehicle may, upon determining that the power supply through the first main signal line is in a normal state and the power supply through the second main signal line is in a failure state, determine that there is a failure in power supply through the second main signal line.

The vehicle may, upon determining that the power supply through the first main signal line is in a failure state and the power supply through the second main signal line is in a normal state, determine that there is a failure in power supply through the first main signal line.

The vehicle may obtain third voltage information detected by the third voltage sensor 150a provided in each of the master control devices, and determine whether there is a failure in power supply of the battery 132 based on the obtained third voltage information.

The vehicle may, upon determining that there is a failure in power supply of the battery 132 (304), display failure information related to the power supply failure in the battery 132 through at least one of the cluster or the AVN device (305).

As shown in FIG. 9, the vehicle may, if the first voltage detected through the first voltage sensor of the power control device 220 is less than the first reference voltage, the voltage detected through the third voltage sensor of the first master control device 151 is less than the first reference voltage, and the voltage detected through the third voltage sensor of the second master control device 152 is less than the first reference voltage, determine that there is a failure in power supply through the first main signal line, and display notification information instructing to inspect the first main signal line and a load controlled by the first and second master control devices 151 and 152.

As shown in FIG. 9, the vehicle may, if the second voltage detected through the second voltage sensor of the power control device 220 is less than the first reference voltage, the voltage detected through the third voltage sensor of the third master control device 153 is less than the first reference voltage, and the voltage detected through the third voltage sensor of the fourth master control device 154 is less than the first reference voltage, determine that there is a failure in power supply through the second main signal line, and display notification information instructing to inspect the second main signal line and a load controlled by the third and fourth master control devices 153 and 154.

As shown in FIG. 9, the vehicle may, if the first voltage detected through the first voltage sensor of the power control device 220 is within the first reference voltage range, the voltage detected through the third voltage sensor of the first master control device 151 is within the first reference voltage range, and the voltage detected through the third voltage sensor of the second master control device 152 is less than the first reference voltage, display notification information instructing to inspect a load controlled by the second master control device 152.

That is, the vehicle may, upon determining that the voltages transmitted from the plurality of master control devices connected to the first main signal line are all less than the first reference voltage, determine that there is a failure in the first main signal line, and upon determining that the voltages transmitted from the plurality of master control devices connected to the second main signal line are all less than the first reference voltage, determine that there is a failure in the second main signal line.

The vehicle may, in response to the voltages transmitted from some of the plurality of master control devices connected to the first main signal line being less than the first reference voltage, determine that there is a failure in the master control devices.

The vehicle may, upon determining that the vehicle is in a key-on state, use the power control device and the plurality of master control devices to diagnose whether there is a failure (306).

The power control device may request a failure diagnosis from the plurality of master control devices.

In the instant case, the plurality of master control devices may obtain third voltage information detected through the third voltage sensor and fourth voltage information detected through the fourth voltage sensor, diagnose whether there is a failure in power supply through the main signal line based on the obtained third voltage information, and diagnose whether there is a failure in power supply through the power signal line based on the obtained fourth voltage information, and upon determining that there is a failure, transmit the failure information to the power control device.

For example, the following description will be made in relation to an example in which the first ignition signal line is connected to the first master control device, the accessory signal line is connected to the second master control device, the third ignition signal line is connected to the third master control device, and the second ignition signal line is connected to the fourth master control device.

The first master control device determines whether there is a failure in power supply applied through the first ignition signal line based on voltage information of the first ignition signal line, the second master control device determines whether there is a failure in power supply applied through the accessary signal line based on voltage information of the accessary signal line signal line, the third master control device determines whether there is a failure in power supply applied through the third ignition signal line based on voltage information of the third ignition signal line, and the fourth master control device determines whether there is a failure in power supply applied through the second ignition signal line based on voltage information of the second ignition signal line.

The power control device may, in response to receiving pieces of failure information from the plurality of master control devices, comprehensively diagnose a failure in power supply of the vehicle using the received pieces of failure information.

That is, the vehicle may comprehensively diagnose a failure in the main signal line and the plurality of power signal lines based on the failure information transmitted from the plurality of master control devices using the power control device (307).

As shown in FIG. 9, the vehicle may, upon determining that the voltage of the first ignition signal line of the first master control device is less than the second reference voltage, determine that there is a failure in the first master control device and the load controlled by the first master control device.

The vehicle may, upon determining that the voltage of the third ignition signal line of the third master control device is less than the second reference voltage, determine that there is a failure in the third master control device and the load controlled by the third master control device.

The vehicle determines whether a failure has occurred based on the comprehensively diagnosed information, and upon determining that a failure has occurred (308) and there is a plurality of pieces of failure information, determine a priority on the pieces of failure information based on the degree of risk (309), and based on the determined priority information, display the failure information including the highest priority order first.

The vehicle may output the failure information in a different way in response to the presence of the user. That is, the vehicle may, upon determining that a user exists in the vehicle (310), display failure information using the cluster or the AVN device (311), and upon determining that a user does not exist in the vehicle, transmit the failure information to the sever or the user terminal (312).

The vehicle may determine that the user exists inside the vehicle upon determining that a time elapsing after switching from a key-on state to a key-off state is within a predetermined time period. The vehicle may also determine whether the user exists inside the vehicle in response to whether the seat belt is attached or detached, whether a pressure applied to the seat is detected, and whether the door is opened or closed.

Meanwhile, the disclosed exemplary embodiments of the present disclosure may be embodied in a form of a recording medium storing instructions executable by a computer. The instructions may be stored in a form of program code, and when executed by a processor, may generate a program module to perform the operations of the disclosed exemplary embodiments of the present disclosure. The recording medium may be embodied as a computer-readable recording medium.

The computer-readable recording medium includes all kinds of recording media in which instructions which may be decoded by a computer are stored, for example, a Read only Memory (ROM), a Random-Access Memory (RAM), a magnetic tape, a magnetic disk, a flash memory, an optical data storage device, and the like.

As is apparent from the above, the present disclosure collects voltage information of each master control device through voltage monitoring of master control devices for each zone, analyzes the collected voltage information to determine a failure of power signal lines, and displays information related to a result of the determination as notification information to provide the user with guidance as to the failure before or during travel, so that the user can recognize a need to inspect the vehicle.

According to an exemplary embodiment of the present disclosure, when a failure occurs in power supply, the user can easily recognize the cause of the failure without visiting a repair shop.

According to an exemplary embodiment of the present disclosure, the time consumed to visit a repair shop and diagnose a failure may be reduced and also the manpower required for the diagnosis of the failure can also be reduced.

According to an exemplary embodiment of the present disclosure, even when the ignition is turned off, a failure of power supply related to ignition is determined and the vehicle is prevented from travelling, so that accidents may be reduced.

According to an exemplary embodiment of the present disclosure, marketability of the vehicle may be improved, user satisfaction, and user reliability may be improved, and product competitiveness may be secured.

Furthermore, the terms such as "unit", "module", etc. included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of predetermined exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A vehicle comprising:
   a power management apparatus including first and second main signal lines connected to a battery and a plurality of power signal lines connected to the battery and including different states of power supply, wherein the plurality of power signal lines includes an accessory signal line, a first ignition signal line, a second ignition signal line, and a third ignition signal line divided according to a state of power supply; and
   a plurality of master control devices connected to the plurality of power signal lines, respectively,
   wherein the power management apparatus further includes:
      a first voltage sensor configured to detect a voltage applied to the first main signal line and output first voltage information related to the voltage detected by the first voltage sensor;
      a second voltage sensor configured to detect a voltage applied to the second main signal line and output second voltage information related to the voltage detected by the second voltage sensor;
      a first communicator configured to communicate with the plurality of master control devices connected to the plurality of power signal lines, respectively; and
      a first processor configured to
         determine whether a failure in power supply of the battery has occurred or a discharge of the battery has occurred based on the first voltage information and the second voltage information received from the first voltage sensor and the second voltage sensor, respectively, and
         determine whether a failure in power supply through the plurality of power signal lines has occurred based on voltage information of the plurality of power signal lines received from the plurality of master control devices, respectively, through the first communicator,
      wherein the first processor is configured to determine a state of the vehicle based on the first voltage information, the second voltage information, and voltage information of the plurality of power signal lines,
      wherein the state of the vehicle includes a parked state, a stopped state in key-off, a stopped state in a key-on, and a travelling state, and
      wherein the first processor is configured to, when the vehicle is the parked state or the stopped state in key-off, determine whether there is a failure in power supply of the battery, and when the vehicle is the stopped state in key-on or the travelling state, determine whether there is a failure in power supply through the accessary line, and first, second, and third ignition signal lines.

2. The vehicle of claim 1, wherein each of the master control devices is connected to the first main signal line or the second main signal line.

3. The vehicle of claim 2, wherein each of the master control devices includes:
   a third voltage sensor configured to detect a voltage of one main signal line connected thereto, and output voltage information related to the detected voltage;
   a fourth voltage sensor configured to detect a voltage applied to one of the plurality of power signal lines and output voltage information related to the detected voltage; and
   a second processor configured to determine whether a failure in power supply through the connected main signal line has occurred and a failure in power supply through the one power signal line has occurred based on the voltage information detected by the third voltage sensor and the voltage information detected by the fourth voltage sensor.

4. The vehicle of claim 3,
   wherein each of the master control devices further includes a second communicator, and
   wherein the second processor is configured to control the second communicator to transmit failure information related to power supply through the connected main signal line and failure information related to power supply through the one power signal line to the power management apparatus.

5. The vehicle of claim 1,
   wherein the first communicator is configured to perform communication with an external device, and
   wherein the first processor is configured to control the first communicator to transmit failure information related to the power supply of the battery or failure information related to the power supply through the power signal lines to the external device.

6. The vehicle of claim 1, wherein the first processor is configured to:
   determine whether a first voltage of the battery is less than a first reference voltage based on the first voltage information received through the first voltage sensor;
   determine whether a second voltage of the battery is less than the first reference voltage based on the second voltage information received through the second voltage sensor; and
   upon determining that the first voltage of the battery is less than the first reference voltage and the second voltage of the battery is less than the first reference voltage, determine that the failure of the battery has occurred or the discharge of the battery has occurred.

7. The vehicle of claim 6, wherein the first processor is configured to:
   upon determining that the first voltage of the battery is within a range including the first reference voltage and the second voltage of the battery is less than the first reference voltage, determine that the second main signal line has failed; and
   upon determining that the first voltage of the battery is less than the first reference voltage and the second voltage of the battery is within the range including the first reference voltage, determine that the first main signal line has failed.

8. The vehicle of claim 6, wherein the first processor is configured to:
receive pieces of voltage information of the power signal lines from the plurality of master control devices, respectively;
determine whether a voltage applied to each of the power signal lines is less than a second reference voltage based on the received pieces of voltage information; and
determine a power signal line in which the voltage is less than the second reference voltage as a failure.

9. The vehicle of claim 8, wherein the first processor is configured to identity the master control device connected to the power signal line which is determined as the failure, and control deactivation of the identified master control device.

10. The vehicle of claim 1, further including a cluster and an audio/video/navigation (AVN) device,
wherein the first processor is configured to control at least one of the cluster or the AVN device to display failure information related to power supply of the battery or failure information related to power supply through the power signal lines.

* * * * *